United States Patent
Daehn et al.

(10) Patent No.: US 6,560,731 B2
(45) Date of Patent: May 6, 2003

(54) METHOD FOR CHECKING THE FUNCTIONING OF MEMORY CELLS OF AN INTEGRATED SEMICONDUCTOR MEMORY

(75) Inventors: Wilfried Daehn, Celle (DE); Erwin Hammerl, Zangberg (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/922,475

(22) Filed: Aug. 3, 2001

(65) Prior Publication Data

US 2002/0026608 A1 Feb. 28, 2002

Related U.S. Application Data

(63) Continuation of application No. PCT/DE00/00283, filed on Feb. 1, 2000.

(30) Foreign Application Priority Data

Feb. 3, 1999 (DE) .......................... 199 04 375

(51) Int. Cl.[7] .............................................. G11C 29/00
(52) U.S. Cl. ..................... 714/719; 714/743; 714/730
(58) Field of Search ........................ 714/42, 718–719, 714/734, 730, 743, 723, 724; 375/262; 365/200–201; 257/503, 537; 345/501, 506, 536

(56) References Cited

U.S. PATENT DOCUMENTS

| | | | | |
|---|---|---|---|---|
| 5,073,891 A | * | 12/1991 | Patel ........................... | 714/720 |
| 5,274,760 A | * | 12/1993 | Schneider ..................... | 345/506 |
| 5,299,202 A | * | 3/1994 | Vaillancourt ................. | 375/262 |
| 5,617,531 A | * | 4/1997 | Crouch et al. ................ | 714/30 |
| 6,279,129 B1 | * | 8/2001 | McConnell et al. ........ | 714/718 |

FOREIGN PATENT DOCUMENTS

| | | | |
|---|---|---|---|
| DE | 197 25 581 C2 | 6/2000 | ........... G11C/29/00 |
| EP | 0 669 623 A1 | 8/1995 | ........... G11C/29/00 |

OTHER PUBLICATIONS

NN890361 (Nonvolatile Ram Failure Rate Reduction Through the Use of Redundancy; IBM Tech. Disclosure Bulletin, vol. 31 Issue No. 10, pp. 61–63, Mar. 1, 1989).*
NN87044976 (Interactive Work Station With Auxiliary Microprocessor for Storage Protection; IBM Tech. Disclosure Bulletin, vol. 29, Issue No. 11, pp. 4976–4982, Apr. 1, 1987).*
NN83024711 (Constants Generator for a VLSI Microprocessor; IBM Tech. Disclosure Bulletin, vol. 25, Issue No. 9, pp. 471–4718, Feb. 1, 1983).*
NN84045996 (Universal Physical Memory Bit Fail Map; IBM Tech. Disclosure Bulletin, vol. 26, Issue No. 11, pp. 5996–6000, Apr. 1, 1984).*

* cited by examiner

*Primary Examiner*—Albert Decady
*Assistant Examiner*—Guy Lamarre
(74) *Attorney, Agent, or Firm*—Laurence A. Greenberg; Werner H. Stemer; Gregory L. Mayback

(57) ABSTRACT

In a method for checking the functioning of memory cells of an integrated semiconductor memory, a first group of the memory cells is tested. The test results, separately for each tested memory cell, are buffer-stored in at least triple copies in a second group of the memory cells. A comparison is made between the copies of each of the test results and the evaluation thereof. The addresses of the respective memory cells of the second group are determined by an address transformation. The latter is configured in such a way that significant clusters of functional errors in an error-affected second group of the memory cells do not influence the result of the test method.

6 Claims, 3 Drawing Sheets

| a3 | a2 | a1 | a0 | b3 | b2 | b1 | b0 |
|---|---|---|---|---|---|---|---|
| 0 | 0 | 0 | 0 | 0 | 0 | 0 | 0 |
| 0 | 0 | 0 | 1 | 0 | 1 | 0 | 1 |
| 0 | 0 | 1 | 0 | 0 | 0 | 1 | 0 |
| 0 | 0 | 1 | 1 | 0 | 1 | 1 | 1 |
| 0 | 1 | 0 | 0 | 0 | 1 | 1 | 0 |
| 0 | 1 | 0 | 1 | 0 | 0 | 1 | 1 |
| 0 | 1 | 1 | 0 | 0 | 1 | 0 | 0 |
| 0 | 1 | 1 | 1 | 0 | 0 | 0 | 1 |
| 1 | 0 | 0 | 0 | 1 | 0 | 0 | 1 |
| 1 | 0 | 0 | 1 | 1 | 1 | 0 | 0 |
| 1 | 0 | 1 | 0 | 1 | 0 | 1 | 1 |
| 1 | 0 | 1 | 1 | 1 | 1 | 1 | 0 |
| 1 | 1 | 0 | 0 | 1 | 1 | 1 | 1 |
| 1 | 1 | 0 | 1 | 1 | 0 | 1 | 0 |
| 1 | 1 | 1 | 0 | 1 | 1 | 0 | 1 |
| 1 | 1 | 1 | 1 | 1 | 0 | 0 | 0 |

FIG 6

|  a₃a₂ \ a₁a₀ | 00 | 01 | 10 | 11 |
|---|---|---|---|---|
| 00 |  | A(1) |  |  |
| 01 |  | A(2) |  |  |
| 10 |  | A(3) |  |  |
| 11 |  |  |  |  |

| b₃b₂ \ b₁b₀ | 00 | 01 | 10 | 11 |
|---|---|---|---|---|
| 00 |  |  |  | A(2) |
| 01 |  | A(1) |  |  |
| 10 |  |  |  |  |
| 11 | A(3) |  |  |  |

FIG 7

| $a_j \cdots a_i$ | $a_{i-1} \cdots \cdots a_0$ |
|---|---|
| ADR1 | ADR2 |

METHOD FOR CHECKING THE FUNCTIONING OF MEMORY CELLS OF AN INTEGRATED SEMICONDUCTOR MEMORY

CROSS-REFERENCE TO RELATED APPLICATION

This application is a continuation of copending International Application No. PCT/DE00/00283, filed Feb. 1, 2000, which designated the United States.

BACKGROUND OF THE INVENTION

Field of the Invention

The present invention relates to a method for checking the functioning of memory cells of an integrated semiconductor memory.

Various test methods are known for checking memory cells of an integrated semiconductor memory with regard to their functional capability. During such a test mode for checking memory cells, by way of example, test data are written to each individual memory cell and read out again. A comparison between the written data and the data read out again provides information about whether or not a functional error is present.

In order, during such functional checking, which requires the transfer of large volumes of data, not to be restricted in the data transfer rate by the number of available memory connections, it is likewise known to provide a test circuit that carries out the functional checking on the same integrated circuit on which the memory is situated. Such a realization, also referred to as a "built-in self test" (BIST), can be gathered from Published, Non-Prosecuted German Patent Application DE 197 25 581 A1. The method described therein provides for only a first group of the memory cells of the integrated memory to be tested and the test results obtained in the process to be buffer-stored in a second group of the memory cells before they are output to a point outside the memory. If both groups are part of a common memory, this results in that the instant at which the test results are output is independent of their generation and the functional checking can be carried out more quickly. In order, for storing the test results, not to have to provide an additional memory which, for example, is part of the test circuit, the test results are buffer-stored in the second group of the memory cells, which is likewise to be tested. Since the latter memory cells have not yet been subjected to functional checking, errors are possible during the buffer-storage of the test results. These can be avoided by using an error correction code, for example, during the buffer-storing of the test results. Errors occurring during buffer-storage are thereby detected, and if appropriate corrected, during the read-out and evaluation of the test results from the memory cells.

A described error correction method makes use of the method of buffer-storing the test results in each case in multiple embodiment in the memory cells of the second group and of performing a comparison between the copies of each of the test results during the read-out of the test results. That value which occurs most often within the copies during the read-out from the memory cells is regarded as the "correct" test result. However, such a method functions reliably only when, in an error-affected memory cell array, a plurality of functional errors that occur are distributed statistically identically, that is to say no significant cluster of functional errors can be ascertained. In this connection, reliable methods that the error correction method obtains a correct test result with the likelihood originally intended for it.

In an error-affected memory cell array in which the memory cells are connected to a respective row line and column line, by contrast, when multiple functional errors occur, significant clusters of the functional errors can be ascertained along column lines or row lines. Thus, in the case of a defective sense amplifier, for example, the row or column line connected to the sense amplifier is affected in terms of its functional capability, and thus so are all the memory cells connected thereto. If the copies of a test result are stored on successive memory cells along a row or column line, in such a case all the copies are affected by a functional error and the "correct" test result can no longer be reconstructed by majority decision.

SUMMARY OF THE INVENTION

It is accordingly an object of the invention to provide a method for checking the functioning of memory cells of an integrated semiconductor memory which overcomes the above-mentioned disadvantages of the prior art methods of this general type, in which an error correction method based on majority decision can be reliably employed.

With the foregoing and other objects in view there is provided, in accordance with the invention, a method for checking the functionality of an integrated semiconductor memory. The method includes testing a first group of memory cells resulting in test results and buffer storing the test results, separately for each tested memory cell, in at least triple copies in a second group of the memory cells. A comparison between the copies of each of the test results is then performed. Information about a functional capability of the memory cells of the first group is determined in a manner dependent on the comparison of the copies. The memory cells are accessed by use of addresses. The addresses of the memory cells contain a first address part through which one of the first group and the second group of the memory cells is accessed, and a second address part through which the memory cells within one of the first group and the second group are accessed. The addresses of each the memory cells contain a number of address bits, and the second address part of a memory cell of the second group is generated, proceeding from a corresponding second address part of a respectively tested memory cell of the first group by an address transformation by alteration of at least one of the address bits.

The method according to the invention provides for a first group of memory cells to be tested and then the test results to be stored in at least triple embodiment in the memory cells of a second group. The addresses or parts of the addresses of the memory cells in which the copies of one of the test results are stored are determined, proceeding from a corresponding part of the address of the tested memory cell, by an address transformation. The address transformation is configured in such a way that significant clusters of functional errors in an as yet untested, error-affected second group of the memory cells do not influence the result of the test method. Consequently, even without knowledge of specific error patterns (clusters of functional errors) of individual types of semiconductor memories, reliable functional testing can be effected, or, by the address transformation, the influence of a known specific error pattern of a memory on the error correction method, which is based on a statistical uniform distribution of functional errors, can be rendered ineffectual.

One embodiment provides for address bits of the addresses of the respective memory cells of the second group in which the copies of one of the test results are stored to be combined with one another. Thus, a sequence of addresses, for example a linear sequence, is transformed into a random sequence. The fact that the memory cells with the copies of a test result are randomly distributed over the memory cell array of the second group results in that clusters of functional errors do not affect the result of the error correction method. Knowledge of a specific error pattern that is respectively present is not necessary.

Another embodiment is based on the fact that functional errors in an error-affected memory with memory cells that are connected to a respective column line and row line cluster along precisely these column and row lines. In order to obtain the "correct" test result from the memory cells of the second group by a majority decision, the memory cells with the copies of a test result are disposed in such a way that their column addresses and row addresses differ. In other words, functional errors along a column line or row line only ever relate to one copy of a test result and the "correct" test result can be reconstructed by the majority.

Further-reaching embodiments specify how the test results are distributed over the memory cell array of the second group, namely at mutually identical address spacings, and how the corresponding addresses or address parts are determined.

In accordance with an added mode of the invention, the integrated semiconductor memory has column lines and row lines. The memory cells are each connected to a respective one of the row lines and a respective one of the column lines and the addresses are decoded in a column address decoder and a row address decoder. The method further includes the step of determining an address of the memory cell of the second group storing a copy of a test result using a spacing value being added to the second address part of the respectively tested memory cell of the first group, so that the column addresses and row addresses of the memory cells of the second group with the copies of one of the test results differ.

In accordance with an additional mode of the invention, there is the step of disposing the memory cells of the second group in which the copies of one of the test results are stored, at mutually identical address spacings.

In accordance with another mode of the invention, there is the step of setting the spacing value in a variable manner at the beginning of the functional checking.

In accordance with a further mode of the invention, there is the step of setting the second address part of the address of the memory cell of the second group which contains a first copy of the test result to be identical to a corresponding second address part of the address of the respectively tested memory cell of the first group. And, proceeding from the second address part of the address of the memory cell, the addresses of the memory cells which contain the other copies of the test result are determined.

Although the invention is illustrated and described herein as embodied in a method for checking the functioning of memory cells of an integrated semiconductor memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 6 is an illustration a group of memory cells in which a test result is stored in multiple embodiments before and after the transformation regulation according to FIG. 5; and FIG. 7 is an illustration of a memory cell address.

DESCRIPTION OF THE PREFERRED EMBODIMENTS

Figure 1:
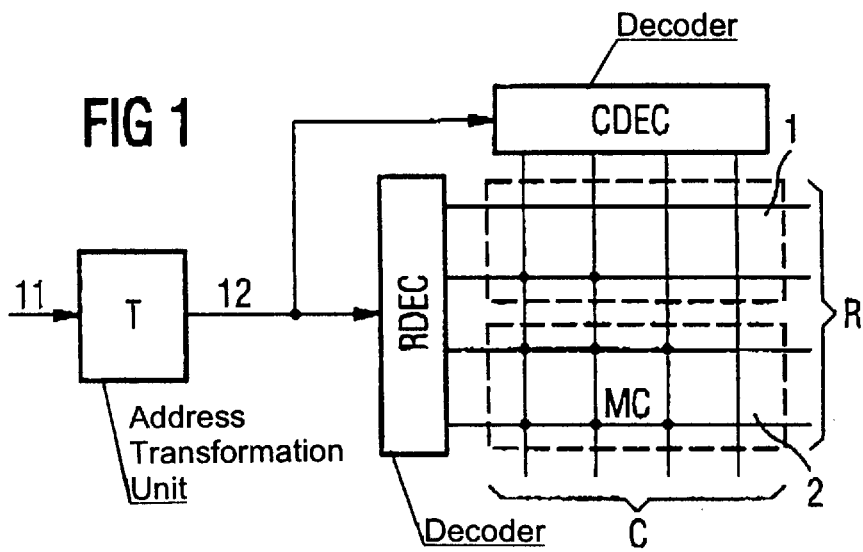
FIG. 1 is a block diagram of a memory cell array with a device for address transformation according to the invention.

In all the figures of the drawing, sub-features and integral parts that correspond to one another bear the same reference symbol in each case. Referring now to the figures of the drawing in detail and first, particularly, to FIG. 1 thereof, there is shown a detail from a memory cell array with a device T for address transformation. In the course of a test method, memory cells MC, which are in this case connected to a respective column line C and row line R, of a first group 1 are tested. The test results, separately for each tested memory cell, are buffer-stored in at least triple embodiment in the memory cells MC of a second group 2 which have not yet been tested (a method which is also referred to as "triply modular redundancy"). A comparison between the copies of each of the test results can be used to reconstruct the "correct" test result by majority decision. These test results, which provide information about the functional capability of the memory cells MC of the first group 1, are then fed to an evaluation device, in order for example to carry out a redundancy analysis of the tested memory cells. In order, during the determination of the memory cells MC of the second group 2 in which the copies of one of the test results are stored, to be independent of the influence of a specific error pattern that is present, the addresses on an address bus 12 of the memory cells MC are determined by the address transformation unit T. The latter is configured in such a way that an error pattern that is present does not influence the result of the test method.

Addresses via which the memory cells MC are accessed can usually be broken down into a plurality of address parts. FIG. 7 shows an exemplary illustration of an address. The addresses for accessing the memory cells MC illustrated in FIG. 1 contain address bits $a_0$ to $a_j$. The address within the groups 1 and 2 is specified by the address bits $a_0$ to $a_{i-1}$. The next higher address bits $a_i$ to $a_j$ serve for selecting one of the groups (1 or 2) of the memory cells MC, depending on the configuration for example with the aid of a decoder. In this case, the address bits $a_i$ to $a_j$ are designated as the first address part ADR1 and the address bits $a_0$ to $a_{i-1}$ are designated as the second address part ADR2.

In the course of storing the copies of the test result, the addresses of the memory cells MC of the second group 2 in which the copies are stored are determined from the address of the respective tested memory cell MC of the first group 1.

The first address part ADR1 is determined in such a way that the memory cells MC of the second group 2 are selected.

The second address part ADR2 is generated, proceeding from the second address part ADR2 of the respectively tested memory cell of the first group 1, by the address transformation unit T.

Figure 2:
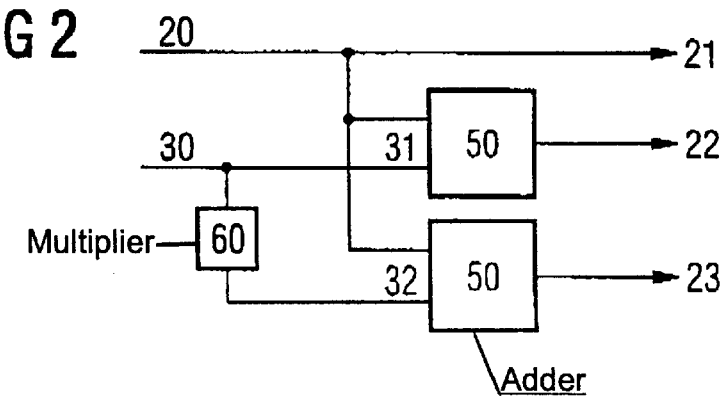
FIG. 2 is a block diagram of an exemplary realization of the address transformation unit.

FIG. 2 illustrates an exemplary realization of the address transformation unit T. The memory cell array according to FIG. 1 has, for example, a significant cluster of functional errors along individual row lines R or column lines C, as already described in the introduction. In order to prevent the majority of the copies of a test result from being connected to the same row line R or column line C, the spacing of the addresses of the memory cells MC which contain the copies of the test result is chosen correspondingly. According to FIG. 2, that is achieved by address spacings 31 and 32 being added, by adders 50, to the second address part ADR2 of an address 20, which corresponds to the second address part ADR2 of the respectively tested memory cell of the first group 1 and is made available for example by a controller or a test circuit via the address bus 12. In this case, the second address part ADR2 of an address 21 of the memory cell with the first copy of a test result corresponds to the corresponding second address part of the address 20. An address 22 of the memory cell with the second copy of the test results correspondingly results from the addition of the second address part ADR2 of the address 20 with the address spacing 30 (or 31). An address 23 of the memory cell with the third copy is calculated from the second address part of the address 20 and the double value of the spacing value 30 (32), which is formed by a multiplier 60. In the case of further copies to be stored, the further procedure will be effected correspondingly.

Figure 3:
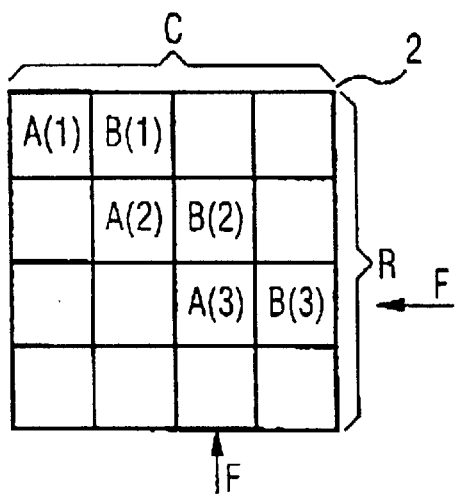
FIG. 3 is an illustration of a group of memory cells in which a plurality of test results are stored in multiple embodiments in each case.

FIG. 3 illustrates the second group 2 of memory cells MC in which a plurality of test results A, B are stored in each case in multiple embodiments using the address transformation mentioned above. In this case, A(1) denotes the first copy of a test result A, B(2) denotes the second copy of a test result B, etc. In this greatly simplified example, the address spacing 30 chosen was the number of row lines R plus 1 (ascending order along a column line C). If the addresses are subdivided into column and row addresses (which are decoded in decoders CDEC and RDEC), it is evident that the column addresses and row addresses of the memory cells of the second group 2 with the copies of a test result A or B differ. If row lines R are to be skipped, for example because typically a plurality of adjacent row lines R have functional errors, the address spacing 30 is correspondingly enlarged. Therefore, the spacing value 30 can advantageously be set in a variable manner at the beginning of the functional checking. The example according to FIG. 3 reveals that, in the event of a functional error along a column line C or row line R (identified by a respective arrow F), the "correct" test result can be reconstructed by majority decision since only one copy of a test result A, B (in the example A(3), B(2) or A(3), B(3)) is affected by an error of this type.

Figures 4, 5:
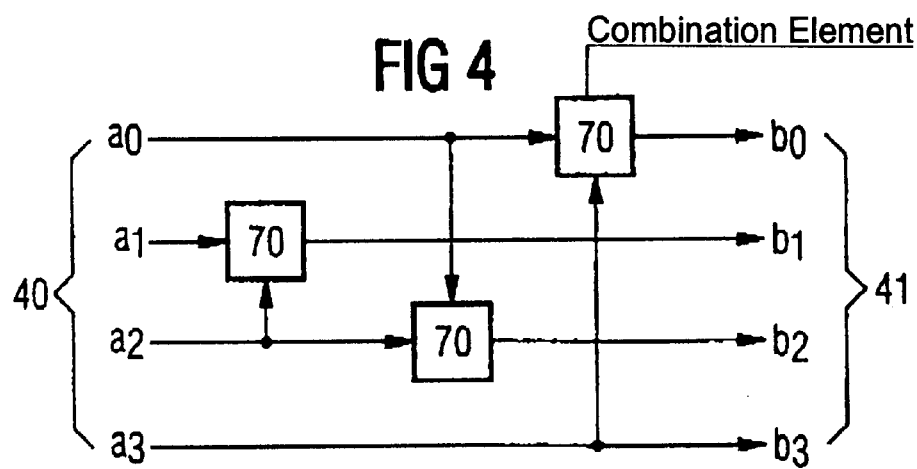
FIG. 4 is a block diagram of a further exemplary realization of the address transformation unit.
FIG. 5 is a truth table associated with FIG. 4.

FIG. 4 illustrates a further realization of the address transformation unit T. In this case, the address bits a0 to a3 and b0 to b3 form the second address part ADR2 of respective addresses 40 and 41. The individual address bits a0 to a3 of the address 40 are combined with one another by combination elements 70 in such a way as to produce a random constellation of the address bits b0 to b3. The address bits b0 to b3 determine the respective memory cell within the second group 2 in which a copy of a test result is stored. Thus, a sequence of addresses 40, which, for example also like in the preceding example, are made available by a controller or a test circuit, is transformed into a random sequence of addresses 41. The combination elements 70 are in this case embodied as gates with EXCLUSIVE-OR logic combination. The random nature becomes clear from the table according to FIG. 5, which describes the combination relationship of the signals according to the configuration of FIG. 4. An ordered sequence of address bits a0 to a3 is transformed into an unordered sequence of address bits b0 to b3, which is interpreted as a random sequence in this connection. Such a random sequence is to be understood here in the sense of a pseudo random sequence, as is generated, in principle, for example by a generally known random number generator. The embodiment of the address transformation unit T can also vary accordingly.

FIG. 6 illustrates, in the top part, the second group 2 of the memory cells MC in which copies of a test result A are stored at successive addresses along a column line C. The numbers 0 and 1 at the edge of the individual row and column lines specify the occupancy of the respective bit lines a0 to a3 by a "logic 0" and logic 1". If the bit lines a0 to a3 are then fed to the address transformation unit T according to FIG. 4 before storage of the test results, the copies of the test result A are randomly stored in the second group 2 of the memory cells MC in a manner distributed over the memory cell array (bottom part of FIG. 6 with occupancy of the bit lines b0 to b3).

As a result of such address transformation, functional errors in an error-affected memory cell array of the second group 2 are statistically equally distributed from an application standpoint, as a result of which error correction methods based on a statistically uniform distribution of functional errors can again be reliably employed. In this case, the nature of a typical error pattern does not exercise any influence and, accordingly, need not be known either. However, in order to be able unambiguously to reconstruct the test results of the individual examined memory cells MC of the first group 1 during the evaluation of the test results stored in the second group 2, for each address 40 (a0 to a3) there must be at least one transformed address 41 (b0 to b3), which must be assigned to an address 40. Or to put it another way, not more than one address 40 must be mapped on to a transformed address 41, since otherwise unambiguous reconstruction is no longer possible. This is ensured in accordance with the address transformation unit T according to FIG. 4.

The method according to the invention and the embodiments thereof can be realized by hard-wired logic, e.g. in the form of the address transformation unit T according to the figures of the drawing, or under program control. In the latter case, by way of example, a controller or a test circuit would process a corresponding test program, for example taking as a basis a transformation table like that of FIG. 5 in a read-only memory provided for the purpose. The use of these two variants for carrying out functional checking in memories is known to the person skilled in the art from the realization of built-in self-tests.

We claim:

1. A method for checking a functionality of an integrated semiconductor memory, which comprises the steps of:
testing a first group of memory cells resulting in test results;
buffer storing the test results, separately for each tested memory cell, in at least triple copies in a second group of the memory cells;
performing a comparison between the copies of each of the test results;
determining information about a functional capability of the memory cells of the first group in a manner dependent on the comparison of the copies; and accessing the memory cells by use of addresses, the addresses of the memory cells contain a first address part through which one of the first group and the second group of the memory cells is accessed, and a second address part through which the memory cells within one of the first group and the second group are accessed, the addresses of each the memory cells contain a number of address bits, and the second address part of a memory cell of the second group is generated, proceeding from a corresponding second address part of a respectively tested memory cell of the first group by an address transformation by alteration of at least one of the address bits.

2. The method according to claim 1, which comprises combining the address bits with one another by performing the address transformation in order to obtain a random sequence of transformed addresses from a sequence of the addresses.

3. The method according to claim 1, wherein the integrated semiconductor memory has column lines and row lines, the memory cells are each connected to a respective one of the row lines and a respective one of the column lines and the addresses are decoded in a column address decoder and a row address decoder, the method which further comprises the steps of:

determining an address of the memory cell of the second group storing a copy of a test result using a spacing value being added to the second address part of the respectively tested memory cell of the first group, so that the column addresses and row addresses of the memory cells of the second group with the copies of one of the test results differ.

4. The method according to claim 3, which comprises disposing the memory cells of the second group in which the copies of one of the test results are stored, at mutually identical address spacings.

5. The method according to claim 3, which comprises setting the spacing value in a variable manner at a beginning of the functional checking.

6. The method according to claim 3, which comprises setting the second address part of the address of the memory cell of the second group which contains a first copy of the test result to be identical to a corresponding second address part of the address of the respectively tested memory cell of the first group and, proceeding from the second address part of the address of the memory cell, the addresses of the memory cells which contain the other copies of the test result are determined.

* * * * *